US012688902B2

(12) United States Patent
Liu et al.

(10) Patent No.: US 12,688,902 B2
(45) Date of Patent: Jul. 21, 2026

(54) SCHEDULING SCAN OPERATIONS IN MEMORY SUB-SYSTEMS

(71) Applicant: Micron Technology, Inc., Boise, ID (US)

(72) Inventors: Yang Liu, San Jose, CA (US); Zhenlei Shen, Milpitas, CA (US); Aaron Lee, Sunnyvale, CA (US); Yue Wei, Shanghai (CN); Xiaoxin Zou, Singapore (SG); Woei Chen Peh, Singapore (SG)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 18/818,260

(22) Filed: Aug. 28, 2024

(65) Prior Publication Data

US 2026/0066019 A1    Mar. 5, 2026

(51) Int. Cl.
*G11C 29/10* (2006.01)
*G11C 29/12* (2006.01)

(52) U.S. Cl.
CPC .......... *G11C 29/10* (2013.01); *G11C 29/1201* (2013.01); *G11C 29/12015* (2013.01)

(58) Field of Classification Search
CPC ................ G11C 29/10; G11C 29/1201; G11C 29/12015
See application file for complete search history.

(56) References Cited

U.S. PATENT DOCUMENTS

| | | | |
|---|---|---|---|
| 12,277,984 B2 | 4/2025 | Hu et al. | |
| 2016/0225440 A1 | 8/2016 | Han | |
| 2020/0051621 A1 | 2/2020 | Papandreou et al. | |
| 2020/0097211 A1 | 3/2020 | Alsasua et al. | |
| 2022/0076765 A1* | 3/2022 | Muchherla | G11C 16/26 |
| 2022/0084605 A1* | 3/2022 | Muchherla | G11C 16/34 |
| 2022/0164263 A1 | 5/2022 | Liikanen et al. | |

OTHER PUBLICATIONS

International Search Report and Written Opinion for International Application No. PCT/US2025/043795, mailed Dec. 29, 2025, 09 Pages.

* cited by examiner

*Primary Examiner* — Han Yang
(74) *Attorney, Agent, or Firm* — Lowenstein Sandler LLP

(57) ABSTRACT

For each voltage offset bin of a plurality of voltage offset bins, a corresponding period of scan operations of memory blocks associated with the voltage offset bin is determined. For each voltage offset bin of the plurality of voltage offset bins, a corresponding scheduling time offset of scan operations is determined. For a chosen voltage offset bin, based on a period of scan operations associated with the chosen voltage offset bin and a scheduling time offset associated with the chosen voltage offset bin, a scan operation is scheduled. The scan operation with respect to one or more blocks associated with the chosen voltage offset bin is performed.

20 Claims, 5 Drawing Sheets

Period of Scan Operations: [1, 2, 4, 8]
Scheduling Time Offset: [0, 0, 3, 5]

400

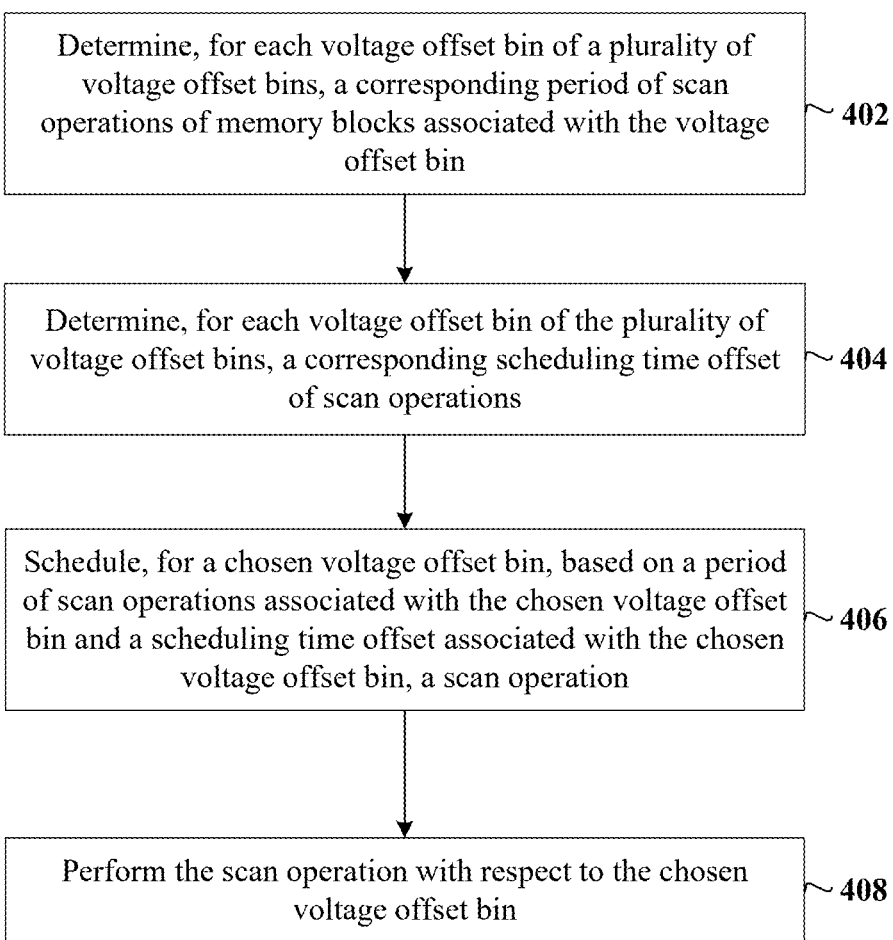

Determine, for each voltage offset bin of a plurality of voltage offset bins, a corresponding period of scan operations of memory blocks associated with the voltage offset bin    ⟊ 402

Determine, for each voltage offset bin of the plurality of voltage offset bins, a corresponding scheduling time offset of scan operations    ⟊ 404

Schedule, for a chosen voltage offset bin, based on a period of scan operations associated with the chosen voltage offset bin and a scheduling time offset associated with the chosen voltage offset bin, a scan operation    ⟊ 406

Perform the scan operation with respect to the chosen voltage offset bin    ⟊ 408

FIG. 4

SCHEDULING SCAN OPERATIONS IN MEMORY SUB-SYSTEMS

TECHNICAL FIELD

Embodiments of the disclosure relate generally to memory sub-systems, and more specifically, relate to scheduling scan operations in memory sub-systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 illustrates an example schedule of scan operations to be performed on voltage offset bins using scheduling time offsets, in accordance with some embodiments of the present disclosure.

FIG. 4 illustrates a flow diagram of scheduling scan operations in memory sub-systems, in accordance with some embodiments of the present disclosure.

DETAILED DESCRIPTION

Figure 1:
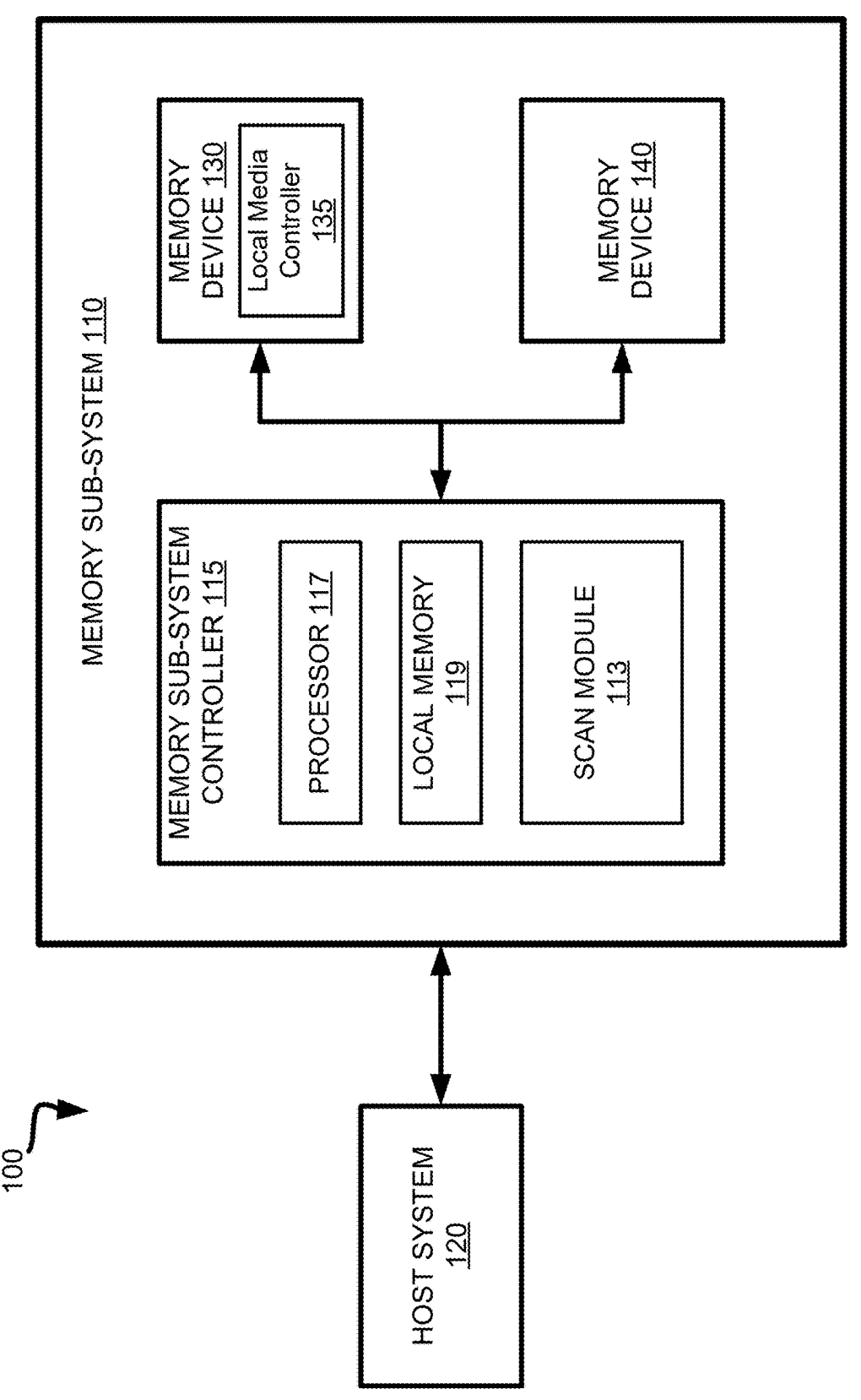
FIG. 1 illustrates an example computing system that includes a memory sub-system, in accordance with some embodiments of the present disclosure.

Aspects of the present disclosure are directed to using sample offsets to distribute block family error avoidance (BFEA) scan tasks to minimize quality of service (QoS) impact on memory sub-systems. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more dies. Each die can include of one or more planes. For some types of non-volatile memory devices (e.g., NAND devices), each plane includes of a set of physical blocks.

Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells, each of which can store, depending on the memory cell type, one or more bits of information. A memory cell can be programmed (e.g., written to) by applying a certain voltage to the memory cell, which can result in an electrical charge being held by the memory cell, thus allowing modulation of the voltage distributions produced by the memory cell. Due to the phenomenon known as slow charge loss, a threshold voltage of a memory cell can change over time as the electric charge of the cell degrades, which is referred to as "temporal voltage shift" (since the degrading electrical charge can cause the voltage distributions to shift along the voltage axis toward lower voltage levels). The temporal voltage shift can be selectively tracked for programmed blocks grouped by block families. A block family can refer to a set of blocks that have been programmed within a specified time window and a specified temperature window. The failure to mitigate the temporal voltage shift caused by the slow charge loss can result in an increased bit error rate in read operations.

It can be difficult to track the slow charge loss for individual memory blocks (generally referred to herein as blocks). Therefore, blocks that were programmed within a specific time window and a specific temperature window can be grouped into a block family. A newly created block family can be associated with the first voltage offset bin. A calibration process can be periodically performed (e.g., by a memory sub-system controller) to associate each die of every block family with a voltage offset bin of a plurality of voltage offset bins. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. The associations of blocks with block families and block families and dies with voltage offset bins can be stored in respective metadata tables maintained by the memory sub-system (e.g., by a memory sub-system controller).

For scheduling the scan operations, a sequence of scan intervals of equal duration can be specified. Accordingly, for a given voltage offset bin, respective scan operations can be scheduled to be performed in at least a subset of scan intervals (e.g., every k-th scan interval, where k*D is the period of scan operations of the given voltage offset bin, assuming that D is the duration of the scan interval). However, this scheduling technique may produce uneven distributions of scan operations over the scan intervals, which may, in turn, adversely affect the overall efficiency of memory access operations.

Aspects of the present disclosure address the above and other deficiencies by introducing, for each voltage offset bin, a corresponding scheduling time offset to be applied in scan operation scheduling in order to produce a more even distribution of the scheduled scan operations over the sequence of scan intervals.

The scheduling time offset may represent the number of scan intervals by which the scheduled scan operations would be delayed from the k-th scan interval, where k*D is the period of scan operations of a given voltage offset bin, assuming that D is the duration of the scan interval. In other words, instead of performing the scan operations, for a given voltage offset bin, every k-th scan interval starting from the 1st scan interval, the scan operations will be delayed every time by the scheduling time offset. In an illustrative example, instead of scheduling the scan operations during the scan intervals having the ordinal numbers of k, 2 k, 3 k, etc., the scan operations will be scheduled during the scan intervals having the ordinal numbers of k+d, 2 k+d, 3 k+d, etc., where d is the scheduling time offset.

Advantages of the present disclosure include producing a more even distribution of scheduled scan operations over the sequence of scan intervals, thus improving the overall frequency of memory access operations and reducing potential QoS impact on a host device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe or CXL bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a scan module 113 that can determine scheduling time offsets that are associated with voltage offset bins. The scan module 113 can schedule scan operations (e.g., BFEA scan operations) to be performed on the voltage offset bins such that the scan operations are evenly distributed among a plurality of scan intervals. The scan module 113 can schedule the scan operations associated with each voltage offset bin based on the scheduling time offset and a period of scan operations associated with each voltage offset bin. In some embodiments, the memory sub-system controller 115 includes at least a portion of the scan module 113. In some embodiments, the scan module 113 is part of the host system 120, an application, or an operating system. In other embodiments, local media controller 135 includes at least a portion of scan module 113 and is configured to perform the functionality described herein.

Figure 2:
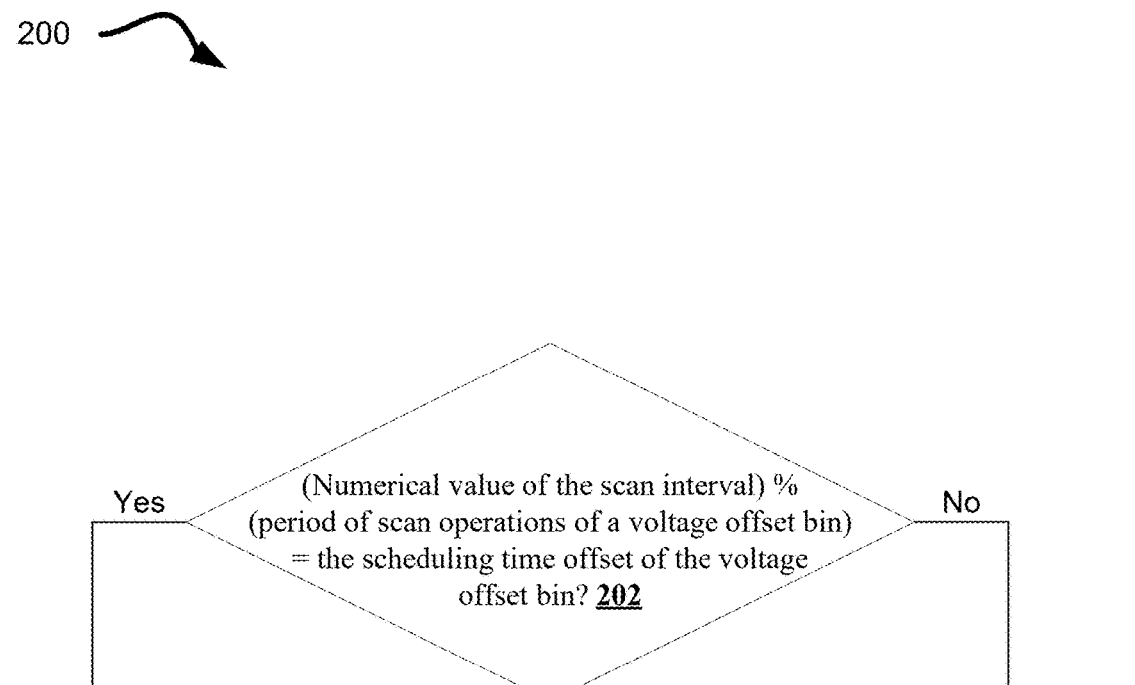
FIG. 2 illustrates a flow diagram of an example method of performing scan operations on voltage offset bins, in accordance with some embodiments of the present disclosure.

FIG. 2 illustrates a flow diagram of an example method of performing scan operations on voltage offset bins, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the scan module 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 3:
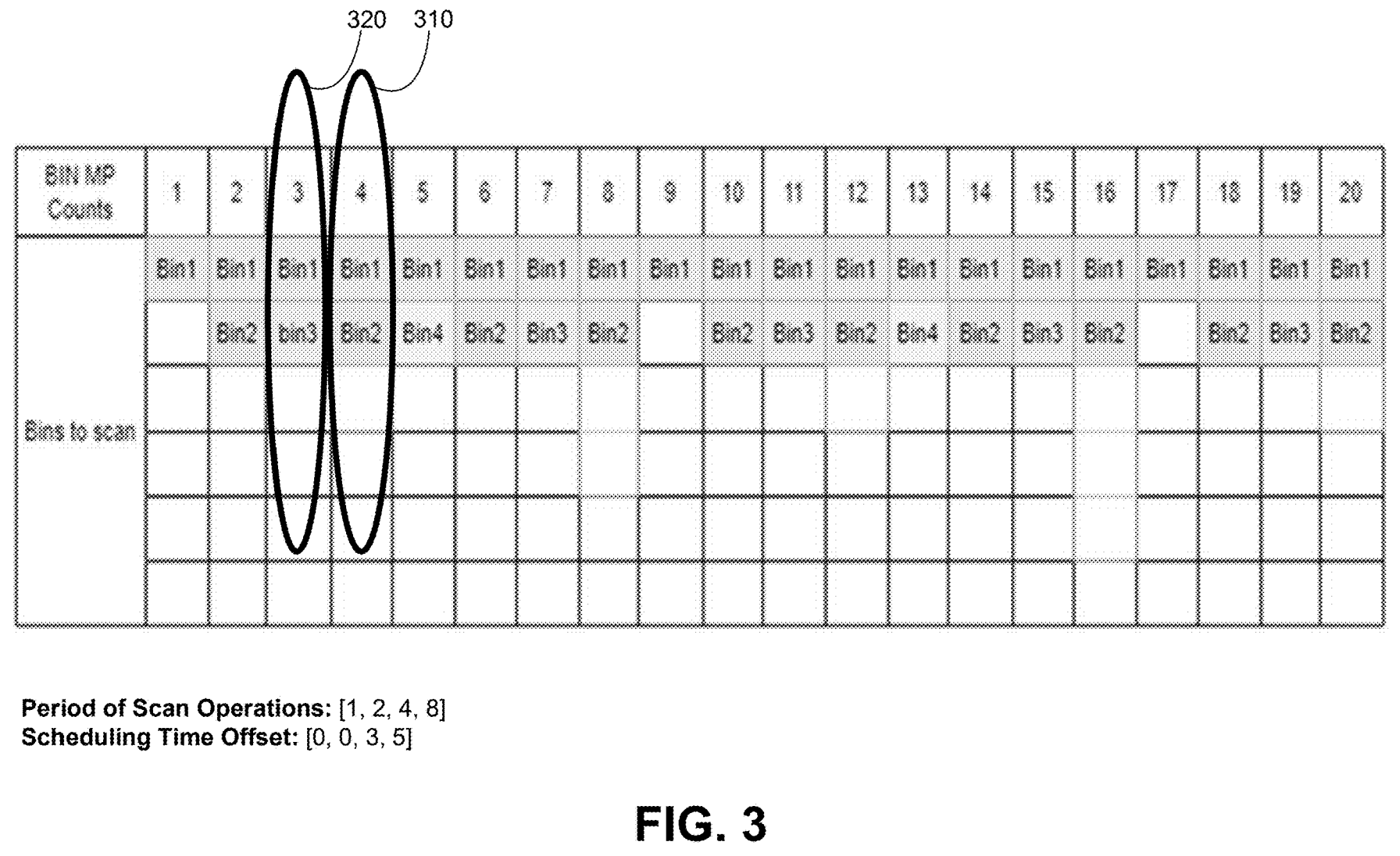

At operation 202, the processing logic (e.g., the scan module 113) can determine, at each scan interval and for each voltage offset bin, whether a numerical value of a scan interval (e.g., a count of units of time) modulo a period of scan operations of the voltage offset bin is equal to a scheduling time offset associated with the voltage offset bin. The count of units of time can be based on a minimum period of scan operations among all voltage offset bins of a plurality of voltage offset bins. As described above, different voltage offset bins can be associated with different periods of scan operations that are used to identify scan intervals during which a scan operation is performed on a voltage offset bin. FIG. 3 illustrates example scan operations to be performed on voltage offset bins, in accordance with some embodiments of the present disclosure. As illustrated in FIG. 3, scan operations on Bin1, Bin2, Bin3, and Bin4 are performed during different scan intervals. As described herein, the scan operations are scheduled based on the period of scan operations associated with each voltage offset bin and the scheduling time offset associated with each voltage offset bin. For example, voltage offset bins [Bin1, Bin2, Bin3, Bin4] can be associated with periods of scan operations such as [1, 2, 4, 8]. According to the periods of scan operations, Bin1 is scanned every scan interval, Bin2 is scanned every 2 scan intervals, Bin3 is scanned every 4 scan intervals, and Bin4 is scanned every 8 scan intervals.

The scheduling time offset can indicate the displacement of the scan operation associated with the voltage offset bin from an intended scan interval in order to evenly distribute scan operations across scan intervals. The scheduling time offset, and a numerical value associated with the scheduling time offset, associated with the voltage offset bin can be determined based on selecting a number (e.g., at random) from a uniform distribution. The selected number can be scaled to an integer range (e.g., [0; N−1], where N can be the period of scan operations associated with the voltage offset bin). For example, the scheduling time offset associated with Bin3 can be 3 and the scheduling time offset associated with Bin4 can be 5. Referring to FIG. 3, to determine whether a scan operation on Bin3 is performed during a scan interval 3, the scan module 113 can determine whether the numerical value of the scan interval 3 modulo the period of scan operations of Bin3 is equal to the scheduling time offset that is associated with Bin3 (e.g., whether 3 modulo 4 is equal to 3). As a further example, to determine whether a scan operation on Bin4 is performed during scan interval 8, the scan module 113 can determine whether the numerical value of the scan interval 8 modulo the period of scan operations of Bin4 is equal to the scheduling time offset that is associated with Bin4 (e.g., whether 8 modulo 8 is equal to 5).

Based on determining that the numerical value of the scan interval modulo the period of scan operations of the voltage offset bin is not equal to the scheduling time offset that is associated with the voltage offset bin at operation 202, then, at operation 204, the scan module 113 does not perform a scan operation on the voltage offset bin. For example, to determine whether a scan operation on Bin3 is performed during scan interval 1, the scan module 113 can determine whether 1 modulo 4 is equal to 3. Since 1 modulo 4 is not equal to 3, the scan module 113 can determine that a scan operation on Bin3 is not performed during scan interval 1. Further, to determine whether a scan operation on Bin4 is performed during scan interval 8, the scan module 113 can determine whether 8 modulo 8 is equal to 5. Since 8 modulo 8 is not equal to 5, the scan module 113 can determine that a scan operation on Bin4 is not performed during scan interval 8.

However, based on determining that the numerical value of the scan interval modulo the period of scan operations of the voltage offset bin is equal to the scheduling time offset that is associated with the voltage offset bin at operation 202, then, at operation 206, the scan module 113 can perform the scan operation on the voltage offset bin (e.g., scan module 113 can scan one or more memory blocks associated with one or more block families that are assigned to the voltage offset bin). For example, based on determining, during at scan interval 3, that 3 modulo 4 is equal to 3, the scan module 113 can determine that a scan operation on Bin3 is performed during scan interval 3, as illustrated by element 320 of FIG. 3. Further, based on determining, during scan interval 5, that 5 modulo 8 is equal to 5, the scan module 113 can determine that a scan operation on Bin4 is performed during scan interval 5.

The scheduling time offsets of the voltage offset bins (e.g., [Bin1, Bin2, Bin3, Bin4]) can be denoted as [0, 0, 3, 5]. A voltage offset bin that is associated with a scheduling time offset of 0 is also associated with a minimum period of scan operations among a plurality of voltage offset bins. The scheduling time offsets can be used to determine when to perform a scan operation on the respective voltage offset bin. The scan module 113 can generate the schedule of scan operations, as illustrated in FIG. 3, to evenly distribute scan operations across different scan intervals.

FIG. 4 is a flow diagram of an example method 400 for scheduling scan operations in memory sub-systems, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the scan module 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 402, the processing logic (e.g., scan module 113) can determine, for each voltage offset bin of a plurality of voltage offset bins, a corresponding period of scan operations of memory blocks associated with the voltage offset bin. The period of scan operations of each voltage offset bin can be used to determine one or more scan intervals within which a scan operation should be performed on a voltage offset bin. As described above in connection with FIG. 5, the period of scan operations of [Bin1, Bin2, Bin3, Bin4] can be [1, 2, 4, 8].

At operation 404, the processing logic can determine, for each voltage offset bin of the plurality of voltage offset bins, a corresponding scheduling time offset of scan operations. The scheduling time offset associated with a voltage offset bin can be determined based on selecting a number (e.g., at random) from a uniform distribution. The selected number can be scaled to an integer range (e.g., [0; N−1], where N can be the period of scan operations associated with the voltage offset bin).

At operation 406, the processing logic can schedule, for a chosen voltage offset bin, based on a period of scan operations associated with the chosen voltage offset bin and a scheduling time offset associated with the chosen voltage offset bin, a scan operation. FIG. 3 illustrates an example schedule of scan operations performed on Bin1 to Bin4 across different scan intervals.

At operation 408, the processing logic can perform the scan operation with respect to the chosen voltage offset bin. At each scan interval, and in accordance with the schedule of scan operations, the scan module 113 can identify the voltage offset bins on which scan operations should be performed (e.g., identify the voltage offset bins associated with one or more block families that comprise one or more memory blocks to be scanned). To so do, the scan module 113 can determine, for each voltage offset bin, whether the numerical value of the scan interval modulo the period of scan operations of the voltage offset bin is equal to the scheduling time offset associated with the voltage offset bin. When the numerical value of the scan interval modulo the period of scan operations of the voltage offset bin is equal to the scheduling time offset associated with the voltage offset bin, the scan module 113 can scan the voltage offset bin. For example, to determine whether a scan operation should be performed on Bin3, which is associated with a period of scan operations of 4, during scan interval 3, the scan module 113 can determine whether 3 modulo 4 is equal to 3. Since 3 modulo 4 is equal to 3, the scan module 113 scans Bin3 during scan interval 3. Further, to determine whether a scan operation should be performed on Bin3 during scan interval 7, the scan module 113 can determine whether 7 modulo 4 is equal to 3 and, based on determining that it is, the scan module 113 can scan Bin3 during scan interval 7.

Figure 5:
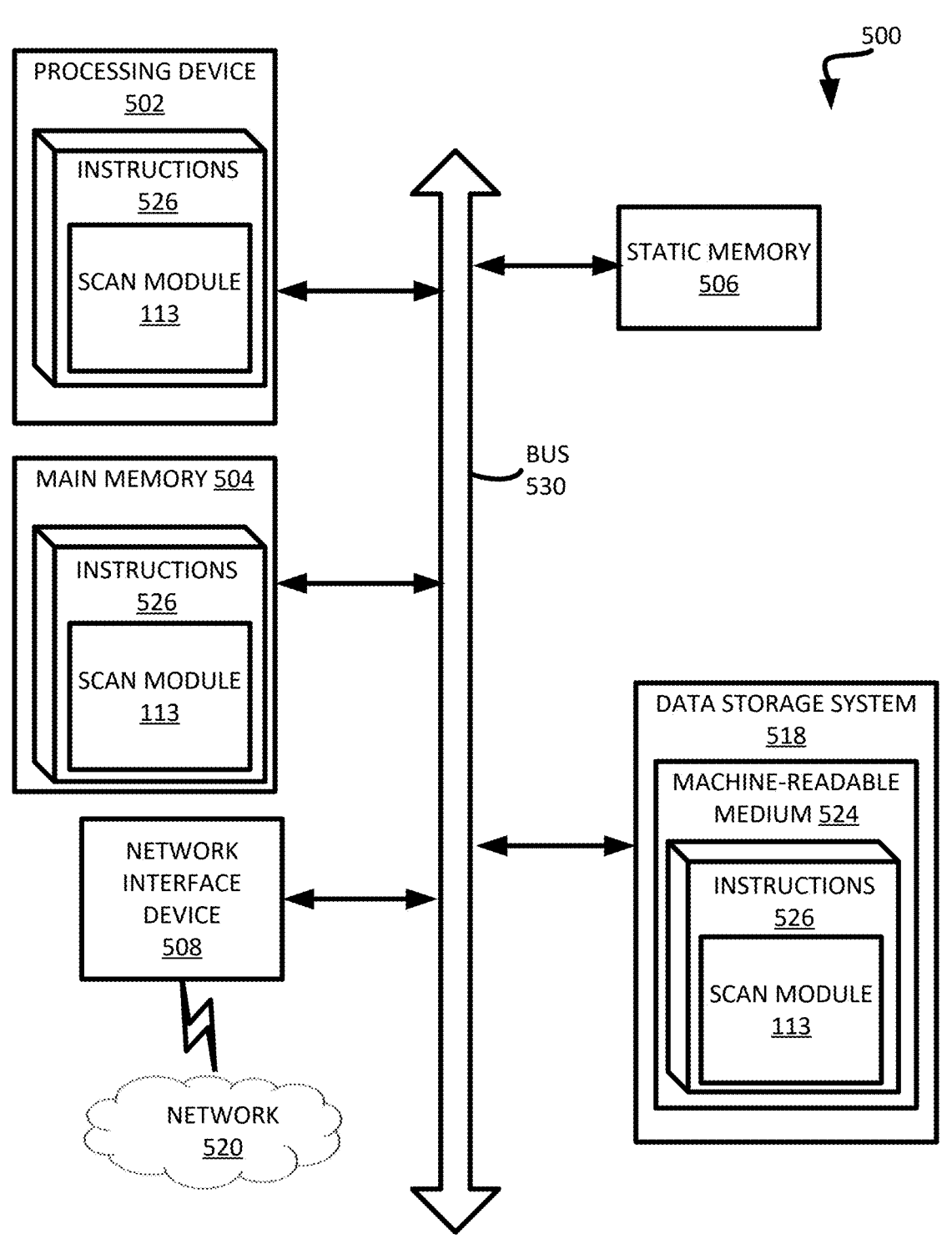
FIG. 5 illustrates a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan module 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a scan module (e.g., the scan module 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device operatively coupled to the memory device and configured to perform operations comprising:
determining, for each voltage offset bin of a plurality of voltage offset bins, a corresponding period of scan operations of memory blocks associated with the voltage offset bin;
determining, for each voltage offset bin of the plurality of voltage offset bins, a corresponding scheduling time offset of scan operations;
scheduling, for a chosen voltage offset bin, based on a period of scan operations associated with the chosen voltage offset bin and a scheduling time offset associated with the chosen voltage offset bin, a scan operation; and
performing the scan operation with respect to one or more memory blocks associated with the chosen voltage offset bin.

2. The system of claim 1, wherein scheduling the scan operation further comprises:
determining whether a numerical value of a scan interval of a plurality of scan intervals modulo the period of scan operations associated with the chosen voltage offset bin is equal to the scheduling time offset associated with the chosen voltage offset bin.

3. The system of claim 1, wherein a count of scan cycles is based on a minimum period of scan operations among the plurality of voltage offset bins.

4. The system of claim 1, wherein a plurality of scheduling time offsets associated with the plurality of voltage offset bins are chosen to minimize a number of voltage offset bins that are scheduled for simultaneous scan operations.

5. The system of claim 1, wherein a zero scheduling time offset is associated with a voltage offset bin having a minimum period of scan operations among the plurality of voltage offset bins.

6. The system of claim 1, wherein a voltage offset bin of the plurality of voltage offset bins is associated with a threshold voltage offset to be applied in performing a read operation with respect to a memory block associated with the voltage offset bin.

7. The system of claim 1, wherein performing the scan operation further comprises:
associating the one or more memory blocks with a second voltage offset bin of the plurality of voltage offset bins.

8. A method comprising:
determining, for each voltage offset bin of a plurality of voltage offset bins, a corresponding period of scan operations of memory blocks associated with the voltage offset bin;
determining, for each voltage offset bin of the plurality of voltage offset bins, a corresponding scheduling time offset of scan operations;
scheduling, for a chosen voltage offset bin, based on a period of scan operations associated with the chosen voltage offset bin and a scheduling time offset associated with the chosen voltage offset bin, a scan operation; and
performing the scan operation with respect to one or more memory blocks associated with the chosen voltage offset bin.

9. The method of claim 8, wherein scheduling the scan operation further comprises:
determining whether a numerical value of a scan interval of a plurality of scan intervals modulo the period of scan operations associated with the chosen voltage offset bin is equal to the scheduling time offset associated with the chosen voltage offset bin.

10. The method of claim 8, wherein a count of scan cycles is based on a minimum period of scan operations among the plurality of voltage offset bins.

11. The method of claim 8, wherein a plurality of scheduling time offsets associated with the plurality of voltage offset bins are chosen to minimize a number of voltage offset bins that are scheduled for simultaneous scan operations.

12. The method of claim 8, wherein a zero scheduling time offset is associated with a voltage offset bin having a minimum period of scan operations among the plurality of voltage offset bins.

13. The method of claim 8, wherein a voltage offset bin of the plurality of voltage offset bins is associated with a threshold voltage offset to be applied in performing a read operation with respect to a memory block associated with the voltage offset bin.

14. The method of claim 8, wherein performing the scan operation further comprises:
associating the one or more memory blocks with a second voltage offset bin of the plurality of voltage offset bins.

15. A non-transitory computer-readable storage medium comprising instructions that, when executed by a processing device, cause the processing device to perform operations comprising:

determining, for each voltage offset bin of a plurality of voltage offset bins, a corresponding period of scan operations of memory blocks associated with the voltage offset bin;

determining, for each voltage offset bin of the plurality of voltage offset bins, a corresponding scheduling time offset of scan operations;

scheduling, for a chosen voltage offset bin, based on a period of scan operations associated with the chosen voltage offset bin and a scheduling time offset associated with the chosen voltage offset bin, a scan operation; and performing the scan operation with respect to one or more memory blocks associated with the chosen voltage offset bin.

16. The non-transitory computer-readable storage medium of claim 15, wherein scheduling the scan operation further causes the processing device to perform operations comprising:

determining whether a numerical value of a scan interval of a plurality of scan intervals modulo the period of scan operations associated with the chosen voltage offset bin is equal to the scheduling time offset associated with the chosen voltage offset bin.

17. The non-transitory computer-readable storage medium of claim 15, wherein a count of scan cycles is based on a minimum period of scan operations among the plurality of voltage offset bins.

18. The non-transitory computer-readable storage medium of claim 15, wherein a plurality of scheduling time offsets associated with the plurality of voltage offset bins are chosen to minimize a number of voltage offset bins that are scheduled for simultaneous scan operations.

19. The non-transitory computer-readable storage medium of claim 15, wherein a zero scheduling time offset is associated with a voltage offset bin having a minimum period of scan operations among the plurality of voltage offset bins.

20. The non-transitory computer-readable storage medium of claim 15, wherein a voltage offset bin of the plurality of voltage offset bins is associated with a threshold voltage offset to be applied in performing a read operation with respect to a memory block associated with the voltage offset bin.

* * * * *